United States Patent
McCarty, Jr. et al.

(10) Patent No.: US 10,612,898 B2
(45) Date of Patent: Apr. 7, 2020

(54) VARIABLE THICKNESS HOLLOW CONFORMAL NOSE CONE

(71) Applicant: Lockheed Martin Corporation, Bethesda, MD (US)

(72) Inventors: Robert J. McCarty, Jr., Plano, TX (US); Don A. Larson, Kennedale, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 1125 days.

(21) Appl. No.: 14/810,914

(22) Filed: Jul. 28, 2015

(65) Prior Publication Data

US 2016/0153756 A1    Jun. 2, 2016

Related U.S. Application Data

(60) Provisional application No. 62/031,442, filed on Jul. 31, 2014.

(51) Int. Cl.
| | | |
|---|---|---|
| *F42B 10/46* | (2006.01) | |
| *F42B 15/34* | (2006.01) | |
| *G06F 17/50* | (2006.01) | |

(52) U.S. Cl.
CPC .............. *F42B 10/46* (2013.01); *F42B 15/34* (2013.01); *G06F 17/50* (2013.01)

(58) Field of Classification Search
CPC ........... F42B 10/46; F42B 15/34; G06F 17/50
See application file for complete search history.

(56) References Cited

U.S. PATENT DOCUMENTS

| | | |
|---|---|---|
| 5,946,143 A | 8/1999 | Whalen |
| 6,180,938 B1 | 1/2001 | Crowther et al. |
| 6,201,230 B1 | 3/2001 | Crowther et al. |
| 6,343,767 B1 | 2/2002 | Sparrold et al. |
| 6,356,396 B1 | 3/2002 | Chen et al. |
| 6,411,445 B1 | 6/2002 | Jackson |
| 6,462,889 B1 * | 10/2002 | Jackson ................. G02B 5/003 244/3.17 |
| 6,552,318 B1 | 4/2003 | Crowther et al. |
| 6,565,036 B1 | 5/2003 | Palathingal et al. |
| 7,042,654 B2 | 5/2006 | Knapp |

(Continued)

OTHER PUBLICATIONS

Richard I. Joseph, Michael E. Thomas, Ray path deviation in a nonhemispherical dome, Proc. SPIE 4375, Window and Dome Technologies and Materials VII, (Sep. 7, 2001); Optics Express 3514 (Year: 2001).*

(Continued)

*Primary Examiner* — Rehana Perveen
*Assistant Examiner* — Chuen-Meei Gan
(74) *Attorney, Agent, or Firm* — Withrow & Terranova, PLLC

(57) ABSTRACT

The embodiments relate to a conformal, sometimes referred to as aerodynamic, nose cone, and in particular to a hollow conformal nose cone that is transparent to electromagnetic radiation of a predetermined wavelength, or wavelengths, and that comprises a variable thickness such that the electromagnetic radiation received on an outer surface of the nose cone forms a predetermined beam pattern within the nose cone. Also disclosed are mechanisms for generating such hollow conformal nose cones.

18 Claims, 7 Drawing Sheets

(56) References Cited

U.S. PATENT DOCUMENTS

| | | | | |
|---|---|---|---|---|
| 7,375,804 | B2* | 5/2008 | Liebman | G01S 7/4818 356/5.01 |
| 7,423,245 | B2 | 9/2008 | Baumgart | |
| 7,858,910 | B2* | 12/2010 | Williams | G01S 17/895 244/3.1 |
| 8,466,407 | B2 | 6/2013 | Martin et al. | |
| 9,534,868 | B1* | 1/2017 | Perryman | F42B 10/46 |
| 2012/0085895 | A1* | 4/2012 | Martin | G02B 27/0018 250/229 |

OTHER PUBLICATIONS

Wang Zhang et al, Conformal dome aberration correction with gradient index optical elements, Optics Express 3514 vol. 22, No. 3 . published Feb. 6, 2014 (Year: 2014).*

James Johnson, Selection of Materials for UV Optics, Dec. 1, 2008. p. 1-6 (Year: 2008).*

Zhang, Wang, Shouqian Chen, and Zhigang Fan. "Conformal dome aberration correction by designing the inner surface." Optics Communications 380 (2016): 15-20. (Year: 2016).*

International Search Report and Written Opinion for International Patent Application No. PCT/US2015/042391, dated Oct. 15, 2015, 11 pages.

Trotta, Patrick, A., "Precision Conformal Optics Technology Program," SPIE Proceedings, Window and Dome Technologies and Materials VII, vol. 4375, Sep. 7, 2001, Tucson, Arizona, SPIE, pp. 96-107.

Yan, Li, et al., "Application of Conformal Optical Design in Star Sensor," SPIE Proceedings, International Symposium on Photoelectronic Detection and Imaging: Optoelectronic System Design, Manufacturing, and Testing, vol. 6624, Mar. 12, 2008, Beijing, China, SPIE, p. 66240S-1 to 66240S-8.

International Preliminary Report on Patentability for International Patent Application No. PCT/US2015/042391, dated Feb. 9, 2017, 8 pages.

* cited by examiner

VARIABLE THICKNESS HOLLOW CONFORMAL NOSE CONE

RELATED APPLICATIONS

This application claims the benefit of provisional patent application Ser. No. 62/031,442, filed on Jul. 31, 2014, entitled "VARIABLE THICKNESS HOLLOW CONFORMAL NOSE CONE," the disclosure of which is hereby incorporated herein by reference in its entirety.

TECHNICAL FIELD

The embodiments relate to a conformal, sometimes referred to as aerodynamic, nose cone, and in particular to a hollow conformal nose cone that is transparent to electromagnetic radiation of a predetermined wavelength, or wavelengths, and that comprises a variable thickness such that the electromagnetic radiation received on an outer surface of the nose cone forms a predetermined beam pattern within the nose cone.

BACKGROUND

Missiles and other munitions are often guided to a target responsive to electromagnetic radiation (EMR) received through a transparent window in a nose cone of the missile. The shape of the nose cone plays a substantial role in the speed and range of a munition. Preferably, the shape of a nose cone is as aerodynamic as practicable to increase range and/or speed of the munition. Unfortunately, a conventional hollow conical nose cone induces substantial distortions in the EMR received through the window of the nose cone. These distortions reduce the accuracy of the munition and, in some situations, can render an optical guidance system inoperable or impractical without complex corrective optics. Efforts have been made to design optical systems that correct such distortions in conical nose cones prior to passing the EMR to guidance components, such as a detector, but such optical systems are complex, increasing cost, adding weight to the munition, decreasing munition range and speed, and increasing the number of components that can fail in the munition.

Consequently, to avoid the issues associated with hollow conical nose cones, the window of a conventional laser-guided munition has a relatively thin spherical surface to reduce the distortion of the EMR passing through the window into the munition. Unfortunately, a spherical surface is not an efficient aerodynamic shape and negatively impacts range and speed of the munition.

SUMMARY

The embodiments relate to methods for designing a hollow conformal nose cone having a variable thickness, computing devices for designing a hollow conformal nose cone having a variable thickness, and hollow conformal nose cones having a variable thickness. The embodiments facilitate an aerodynamic nose cone that is configured to receive electromagnetic radiation (EMR) from the environment on an outer surface of the nose cone, pass the EMR to an inner surface of the nose cone, and form a desired EMR beam pattern within a void of the hollow nose cone. The EMR may be processed, such as by a detector, or detector array, and utilized, for example, for guidance and/or imaging purposes.

In one embodiment, a method for generating a functional definition of a surface of a hollow nose cone shell comprising a transparent material and having an interior void is provided. A computing device comprising a processor accesses a first functional definition of a first surface that comprises one of an outer nose cone surface and an inner nose cone surface. A desired beam pattern of light that is transmitted through the hollow nose cone shell is determined at a plane in the interior void. An optical prescription of a second surface that comprises one of the outer nose cone surface and the inner nose cone surface is determined. The optical prescription provides the desired beam pattern of light at the plane in the interior void based on the first functional definition. A second functional definition that identifies the optical prescription is determined. The second functional definition is stored in a storage device.

In one embodiment, the first surface is an outer conformal surface of the hollow nose cone shell and the second surface is an inner surface of the hollow nose cone shell. In another embodiment, the second surface is an outer conformal surface of the hollow nose cone shell and the first surface is an inner surface of the hollow nose cone shell.

In one embodiment, the desired beam pattern of light is one of a converging beam pattern, a diverging beam pattern, and a collimated beam pattern.

In another embodiment, a nose cone shell that forms a void is provided. The nose cone shell includes a conformal outer nose cone surface and an inner nose cone surface that defines the void and is configured to direct light received at a plurality of different points on the conformal outer nose cone surface into a predetermined output beam pattern toward a plane that is perpendicular to a longitudinal axis of the nose cone shell.

In one embodiment, the plane is within the void.

In one embodiment, a detector is positioned in the void.

In one embodiment, an optical receiver is positioned at an upstream location with respect to the detector.

In another embodiment, a method for defining an inner nose cone surface of a hollow nose cone comprising an outer nose cone surface is provided. A functional definition of the outer nose cone surface of the hollow nose cone is accessed. A plurality of first light ray locations on the outer nose cone surface is identified. For each of the plurality of first light ray locations a corresponding plurality of inner surface light ray locations on the inner nose cone surface is determined. A plurality of inner surface slopes is determined, wherein each inner surface slope defines a slope of the inner nose cone surface at a corresponding inner surface light ray location. The plurality of inner surface slopes are determined by determining a path through the transparent material that a light ray travels given a predetermined angle of incidence of the light ray on the outer nose cone surface at the first light ray location, determining the corresponding second light ray location on the inner nose cone surface at which the light ray will exit the inner nose cone surface given the path, and determining the inner surface slope of the corresponding second light ray location required to direct the light ray in a desired direction into a void of the hollow nose cone. The inner nose cone surface is defined based on the plurality of inner surface light ray locations.

Those skilled in the art will appreciate the scope of the disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the embodiments are not limited to any particular sequence of steps. The use herein of ordinals in conjunction with an element is solely for distinguishing what might otherwise be similar or identical labels, such as "first surface" and "second surface," and does not imply a priority, a type, an importance, or other attribute, unless otherwise stated herein.

The embodiments relate to methods for designing a hollow conformal nose cone having a variable thickness, computing devices for designing a hollow conformal nose cone having a variable thickness, and hollow conformal nose cones having a variable thickness. The embodiments facilitate an aerodynamic nose cone that is configured to receive electromagnetic radiation (EMR) from the environment on an outer surface of the nose cone, pass the EMR to an inner surface of the nose cone, and form a desired EMR beam pattern within a void of the nose cone. The EMR may be processed, such as by a detector, or detector array, and utilized, for example, for guidance and/or imaging purposes.

In particular, the embodiments relate to determining an optical prescription of a nose cone surface to generate a desired beam pattern inside a hollow nose cone. The optical prescription may be determined for an outer nose cone surface based on a definition of an inner nose cone surface, or may be determined for an inner nose cone surface based on the definition of the outer nose cone surface. However, because it may be desirable to design the outer surface of the nose cone strictly based on aerodynamic principles, the embodiments will generally be described in the context of determining an optical prescription for the inner nose cone surface based on the definition of an aerodynamic outer nose cone surface.

Figure 1:
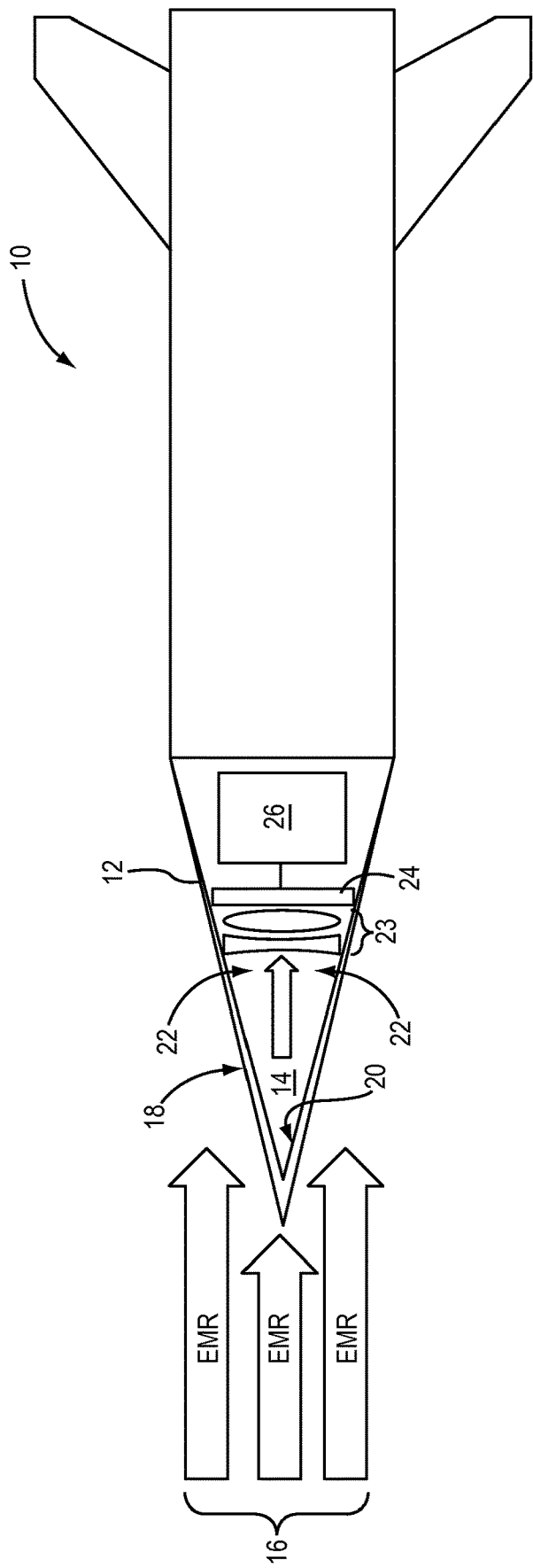
FIG. 1 is a block diagram of a missile utilizing a hollow, variable thickness nose cone according to one embodiment.

Before delving into the details of the embodiments, a high-level overview of a hollow nose cone having a variable thickness according to one embodiment will be discussed to provide context to the subsequent discussion. FIG. 1 is a block diagram of a missile 10 utilizing a hollow, variable thickness nose cone 12 according to one embodiment. The nose cone 12 may be referred to synonymously herein as a nose cone shell, since the nose cone 12 is hollow and forms, or otherwise contains, a void 14. The nose cone 12 is transparent to EMR 16 at a predetermined wavelength, or at a predetermined band of wavelengths. The EMR 16 may be referred to synonymously herein as light, and the term "light" as used herein is not limited to EMR in the visible spectrum, but rather includes EMR of any predetermined wavelength, or predetermined band of wavelengths, including, by way of non-limiting example, infrared and ultraviolet wavelengths. The nose cone 12 may comprise any suitable material transparent to the EMR 16 at the wavelengths of interest. By way of non-limiting example, the nose cone 12 may comprise polycarbonate material, acrylic material, and/ or more common optical glasses such as BK7 for the visible and near infrared (IR) bands; germanium, silicon, sapphire for the mid-wave IR band; and germanium, ZnS, or ZnSe for the long-wave IR (LWIR) band.

The EMR 16 passes into an outer surface 18 of the nose cone 12, travels through the nose cone 12, and is emitted out an inner surface 20 of the nose cone 12 to form an output beam 22. The output beam 22, in some embodiments, has a desired beam pattern, such as a converging beam pattern, a diverging beam pattern, or a collimated beam pattern. In some embodiments, the output beam 22 may be defined in terms of optical power. The output beam 22 may then impact one or more components, such as an optical receiver 23 and a detector 24 that is coupled to additional circuitry 26. The optical receiver 23 may comprise any lens or lenses, including, by way of non-limiting example, any combination of spectral filters, diffractive, refractive, reflective, and/or catadioptric lenses. The detector 24 may comprise a relatively simple detector, such as a quad detector as might be used in an active or semiactive guidance system, or may comprise a more sophisticated detector array of elements suitable for generating images. The detector 24 is preferably sensitive to the particular wavelength or wavelengths of the EMR 16. The additional circuitry 26 may perform any desired function, such as missile guidance, image processing, and the like. The detector 24 may be fixed or "strapped down" and have a fixed but relatively wide field of view, or may be coupled to a gimbal (not illustrated) and thereby cover a relatively large field of regard.

Because the inner surface 20, as described in greater detail herein, has been designed and manufactured to have a particular surface shape, such as a desired optical prescription, the output beam 22 has minimal aberrations, and thus complex optical and/or electronic correction components that might otherwise be necessary to attempt to eliminate or reduce aberrations are not necessary and can be replaced with relatively simple conventional collection (receive) optics, thus reducing the cost, weight, and complexity of the missile 10. In some embodiments, the inner surface 20 is designed to provide the output beam pattern of the output beam 22 at a particular location, or plane, within the void 14.

Figure 2:
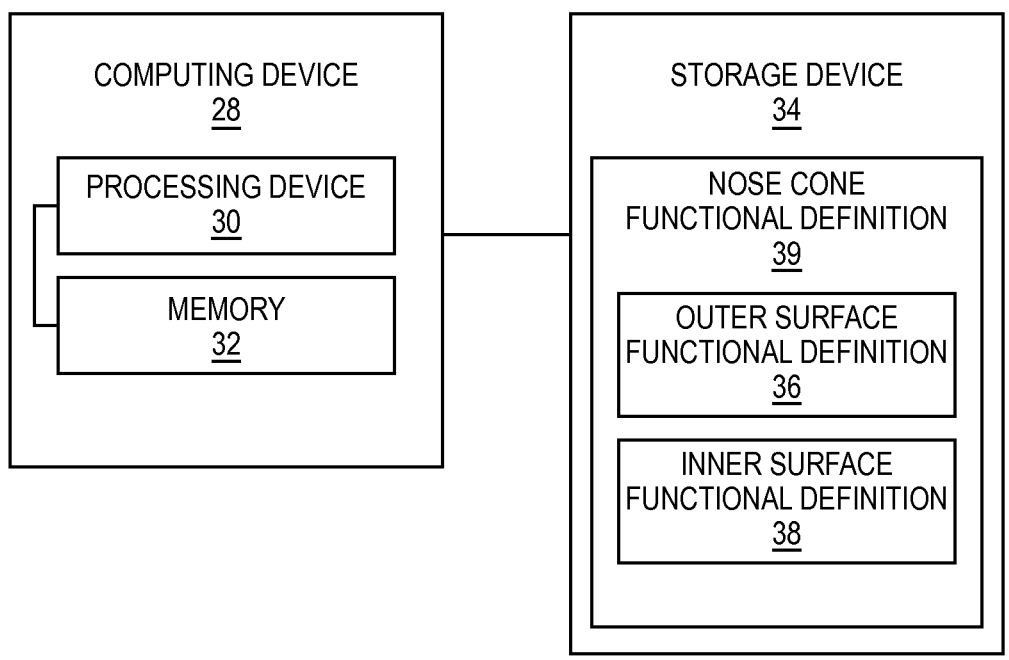
FIG. 2 is a block diagram of a computing device according to one embodiment.

FIG. 2 is a block diagram of a computing device 28 according to one embodiment. The computing device 28 includes a processing device 30 that is coupled to a memory 32. The processing device 30 may comprise any suitable central processing unit, microprocessor, or the like capable of executing instructions to implement the functionality described herein. In other embodiments, the computing device 28 may include special-purpose firmware or circuitry for implementing the functionality described herein.

The computing device 28 includes, or is coupled to, a storage device 34. In one embodiment, the computing device 28 generates an outer surface functional definition 36 of an outer surface of a nose cone given an inner surface functional definition 38, or, alternatively, the computing device 28 generates the inner surface functional definition 38 of the inner surface of the nose cone given the outer surface functional definition 36. Collectively, the outer surface functional definition 36 and the inner surface functional definition 38 compose a nose cone functional definition 39. The functional definitions 36, 38, 39 may also be referred to herein as functional representations. The functional definitions 36, 38, 39 may comprise any information suitable to recreate a surface and may comprise, for example, information that identifies multiple points on the surface, coefficients of a polynomial that defines the surface, a math equation that defines the surface, or the like.

The outer surface functional definition 36 and the inner surface functional definition 38 define the respective outer and inner surfaces of a nose cone and may be used to manufacture the nose cone with the desired outer and inner surfaces. The precise protocol or format of the outer surface functional definition 36 and the inner surface functional definition 38 may differ depending on a particular CAD/CAM module or other component used to generate the functional definitions, but, generally, in one embodiment the outer surface functional definition 36 defines the attributes of the outer surface of the nose cone in terms of X, Y, and Z coordinates at a particular resolution, and the inner surface functional definition 38 defines the attributes of the inner surface of the nose cone in terms of X, Y, and Z coordinates at a particular resolution.

All or a portion of the embodiments may be implemented as a computer program product stored on a transitory or non-transitory computer-usable or computer-readable storage medium, such as the storage device 34. The computer program product includes complex programming instructions, such as complex computer-readable program code, configured to cause the processing device 30 to carry out the steps described herein. Thus, the computer-readable program code can comprise software instructions for implementing the functionality of the embodiments described herein when executed on the processing device 30.

Figure 3:
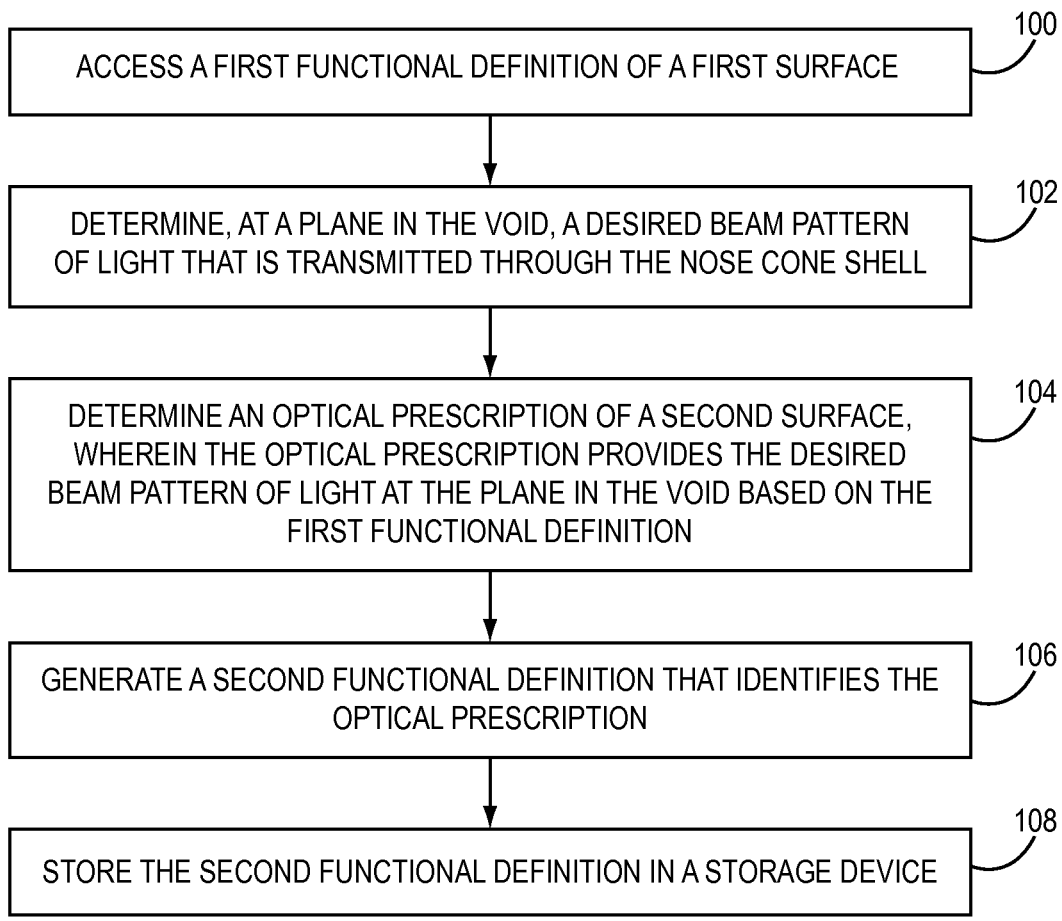
FIG. 3 is flowchart of a method for generating a functional definition of a surface of a hollow nose cone shell comprising a transparent material and having an interior void according to one embodiment.

FIG. 3 is a flowchart of a method for generating a functional definition of a surface of a hollow nose cone shell comprising a transparent material and having an interior void according to one embodiment. The computing device 28 accesses a first functional definition of a first surface of the hollow nose cone shell (FIG. 3, block 100). The first functional definition may comprise the outer surface functional definition 36 of the outer surface, in order to generate the inner surface functional definition 38 of the inner surface, or may comprise the inner surface functional definition 38 of the inner surface in order to generate the outer surface functional definition 36 of the outer surface.

A desired beam pattern of light is determined at a plane in the void of the nose cone shell (FIG. 3, block 102). For example, the desired beam pattern of light may be a collimated beam pattern, a diverging beam pattern, a converging beam pattern, or any other desired beam pattern. An optical prescription of a second surface that provides the desired beam pattern of light at the plane in the void is determined based on the first functional definition (FIG. 3, block 104). The second surface is the surface that differs from the first surface discussed above with regard to block 100. Thus, if the first surface is the outer surface of the nose cone, the second surface is the inner surface of the nose cone. A second functional definition that identifies the optical prescription is determined (FIG. 3, block 106). The second functional definition is stored in the storage device 34 (FIG. 3, block 108). The first and second functional definitions may then be used to manufacture a nose cone.

Figure 4:
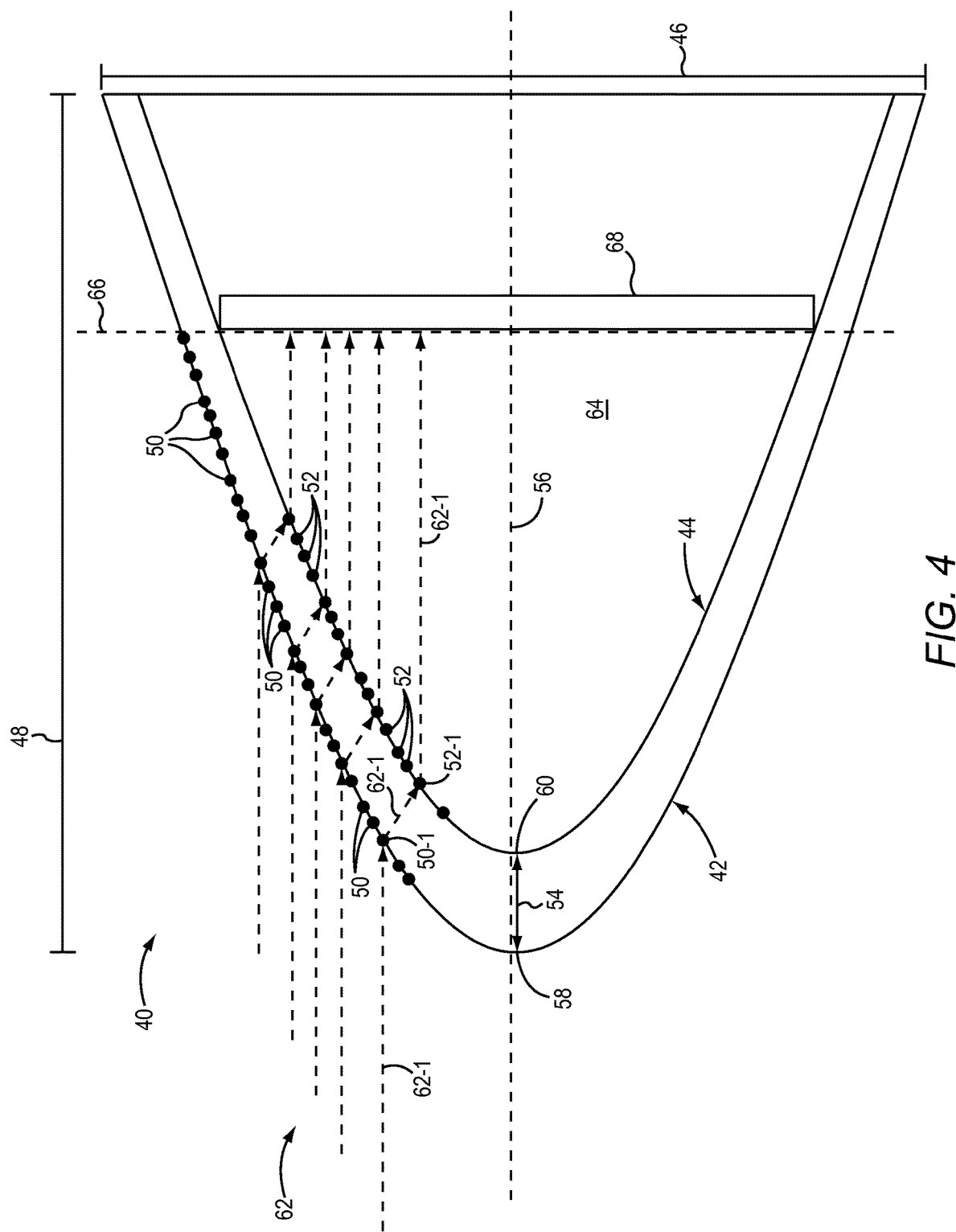
FIG. 4 is a block diagram of a nose cone according to one embodiment.
Figure 5:
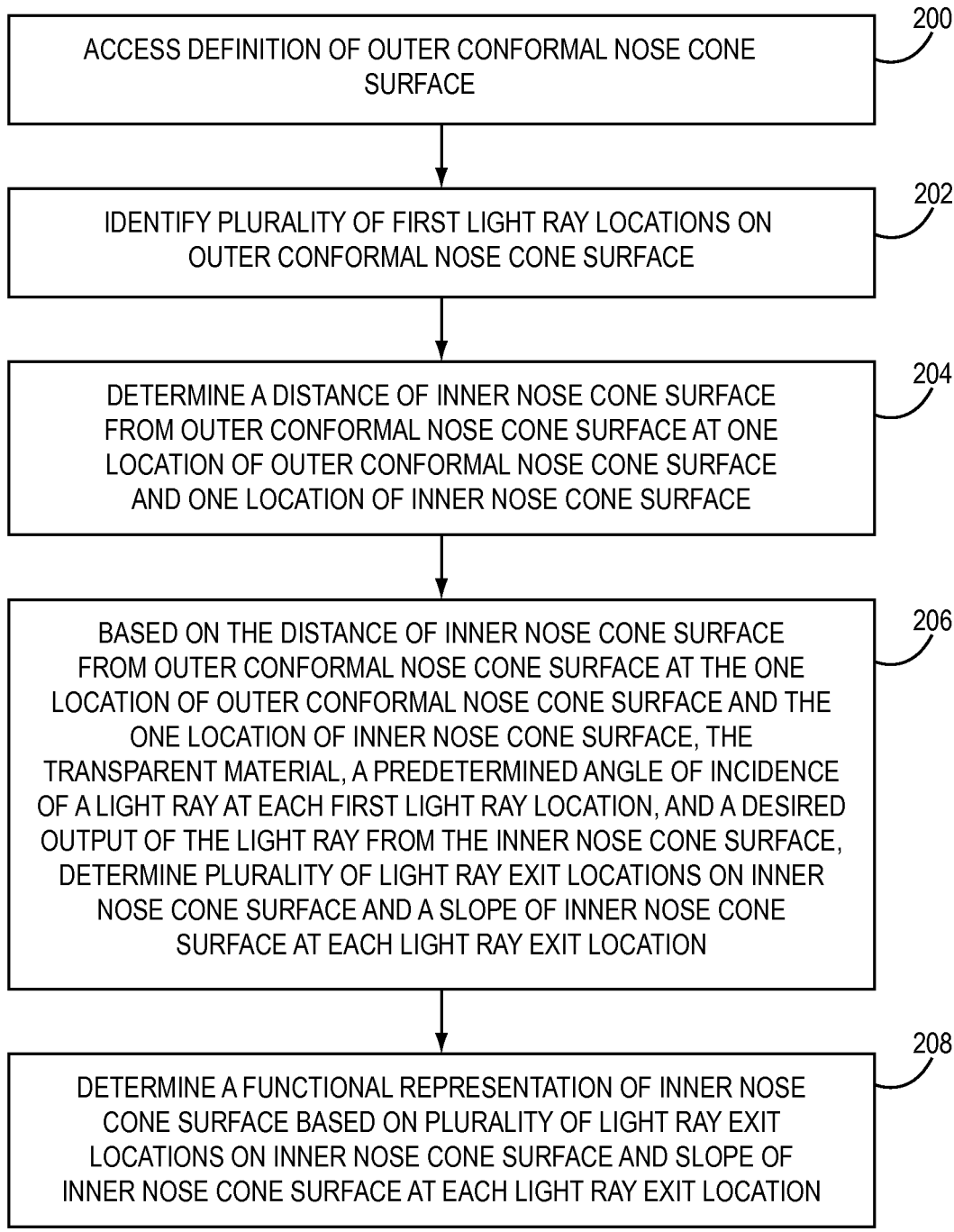
FIG. 5 is a flowchart of a method for designing a hollow nose cone shell having an outer conformal nose cone surface and an inner nose cone surface according to one embodiment.

FIG. 4 is a block diagram of a nose cone 40 according to one embodiment. FIG. 5 is a flowchart of a method for determining an optical prescription for a hollow nose cone shell having an outer conformal nose cone surface and an inner nose cone surface according to another embodiment. FIGS. 4 and 5 will be discussed together.

Referring first to FIG. 4, assume that a definition of an outer conformal nose cone surface 42 has been created. The definition of the outer conformal nose cone surface 42 may have been generated by any suitable design software application or other design mechanism suitable for designing a surface of a nose cone with desired mechanical and aerodynamic drag characteristics and generating the definition of the outer conformal nose cone surface 42. By way of non-limiting example, one such design mechanism involves performing a computational fluid dynamics analysis of a solid model generated using a 3-D computer-aided design (CAD) package to optimize a nose cone shape for desired mechanical and aerodynamic characteristics. In this embodiment, a definition of an inner nose cone surface 44 will be generated based on various factors, as discussed herein. However, the embodiments are not limited to generating a definition of an inner nose cone surface based on a definition of an outer nose cone surface, and can also generate a definition of an outer nose cone surface based on a definition of an inner nose cone surface. As noted, the outer conformal nose cone surface 42 is conformal, sometimes referred to as aerodynamic. The outer conformal nose cone surface 42 can comprise any aerodynamic shape, but in some embodiments, a maximum diameter 46 is less than half of a maximum length 48 of the nose cone 40. Moreover, although not illustrated in FIG. 4, in some embodiments the outer conformal nose cone surface 42 is conical.

Initially, a computing device, such as the computing device 28 (FIG. 2) accesses the definition of the outer conformal nose cone surface 42 (FIG. 5, block 200). The computing device 28 identifies a plurality of first light ray locations 50, 50-1 (generally, first light ray locations 50) on the outer conformal nose cone surface 42 (FIG. 5, block 202). The first light ray locations 50 may also be referred to herein as points on the outer conformal nose cone surface 42. For purposes of illustration, only a subset of the first light ray locations 50 is depicted, and only a further subset of the first light ray locations 50 that are depicted is labeled. The number of first light ray locations 50 that are identified may vary from nose cone to nose cone, and should generally be a number that allows the determination of a suitable number of light ray exit locations 52 on the inner nose cone surface 44 to ensure a sufficient resolution to generate a definition of the inner nose cone surface 44. In some embodiments, the computing device 28 may identify hundreds of thousands of first light ray locations 50. Light ray exit locations 52 may also be referred to herein as points 52.

In one embodiment, the computing device 28 determines a desired, or nominal, thickness 54 of the nose cone 40 at a location of the nose cone 40. In one embodiment, the location may be at the tip of the nose cone 40, such as along a longitudinal axis 56. The longitudinal axis 56 also defines an axis of symmetry of the nose cone 40. In some embodiments, the thickness 54 may be expressed in terms of a distance from one location 58 on the outer conformal nose cone surface 42 to another location 60 on the inner nose cone surface 44 (FIG. 5, block 204).

In one embodiment, the computing device 28 then, for each first light ray location 50, determines a path through the nose cone material that a light ray 62 travels given a predetermined angle of incidence of the light ray 62 on the outer conformal nose cone surface 42 at the respective first light ray location 50. The path that the light ray 62 travels will be in part based on the particular material of the nose cone 40, since different materials have different indexes of refraction. The computing device 28 then determines a corresponding light ray exit location 52 of the light ray 62 at which the light ray 62 will exit the inner nose cone surface 44 given the path. The computing device 28 also determines an inner surface slope of the inner nose cone surface 44 at the corresponding light ray exit location 52 that is required to direct the light ray 62 in a desired direction into a void 64 of the nose cone 40 (FIG. 5, block 206). Collectively, the desired direction is based on a desired beam pattern of light rays 62, which may comprise, by way of non-limiting example, a converging beam pattern, a diverging beam pattern, or a collimated beam pattern. In the example illustrated in FIG. 4, the desired beam pattern is a collimated beam pattern.

In some embodiments, the inner surface slope determined at each light ray exit location 52 may be based on generating a beam pattern at a particular plane 66 that is perpendicular to the longitudinal axis 56 and which intersects the void 64. In some embodiments, in operation, one or more components 68 may be placed at the plane 66, such as an optical receiver, a detector, or the like. The optical receiver may include, for example, any combination of spectral filters, diffractive, refractive, reflective, and/or catadioptric lenses.

As an example, referring to the first light ray location 50-1, the computing device 28 determines a desired angle of incidence of a light ray 62-1 that is incident on the outer conformal nose cone surface 42 at the first light ray location 50-1. In the example illustrated in FIG. 4, the desired angle of incidence is such that the light rays 62 are parallel with respect to the longitudinal axis 56. The process described herein may also make iterative determinations of the inner nose cone surface 44 at each of multiple different angles of incidence to determine a shape of the inner nose cone surface 44 that provides a best compromise over the desired range of angles of incidence. For example, the process may be repeated for each degree up to +/−20 degrees "off axis" with respect to the longitudinal axis 56.

The computing device 28 then determines the path that the light ray 62-1 travels through the material of the nose cone 40, based in part on the index of refraction of the material and the angle of incidence of the light ray 62-1 on the outer conformal nose cone surface 42 at the first light ray location 50-1. The computing device 28 determines that the light ray 62-1 will strike the inner nose cone surface 44 at a light ray exit location 52-1. The computing device 28 then determines an inner surface slope of the inner nose cone surface 44 at the corresponding light ray exit location 52-1 that is required to direct the light ray 62-1 in a desired direction into the void 64.

This process is repeated at each first light ray location 50. Ultimately, a plurality of corresponding light ray exit locations 52 is determined.

The plurality of corresponding light ray exit locations 52 defines the inner nose cone surface 44. Thus, the corresponding light ray exit locations 52 may be the functional representation of the inner nose cone surface 44. In some embodiments, the computing device 28 may use a polynomial or other form of mathematical equation suitable for fitting a surface given a plurality of points, such as the light ray exit locations 52. The functional representation of the inner nose cone surface 44 may comprise the coefficients of a polynomial, a sphere or other parameterized mathematical expression (FIG. 5, block 208).

Figure 6:
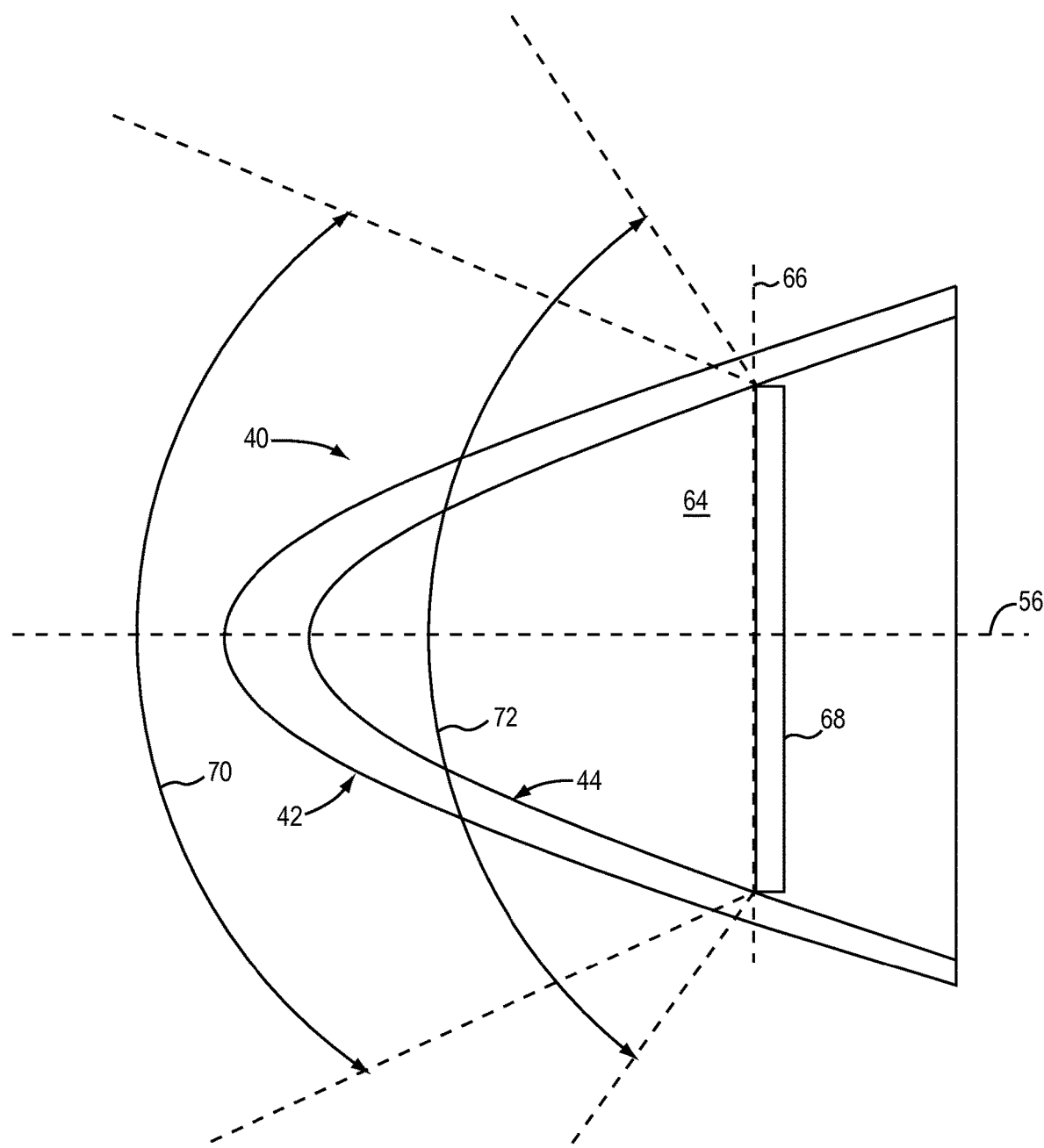
FIG. 6 is a block diagram of the nose cone illustrated in FIG. 4.

FIG. 6 is a block diagram of the nose cone 40 illustrated in FIG. 4. In one embodiment, a component 68 is a detector, or a set of receive optics and a detector, and is strapped down, or fixed, with respect to the inner nose cone surface 44 and has a field of view 70. In another embodiment, the component 68 is a detector or a set of receive optics and a detector, and is coupled to a gimbal or other scanning apparatus and has a field of regard 72.

The nose cone 40 forms the void 64 and has the outer conformal nose cone surface 42 and the inner nose cone surface 44 that defines the void 64 and that is configured to direct light received at a plurality of different points on the outer conformal nose cone surface 42 into a predetermined output beam toward the plane 66 that is perpendicular to the longitudinal axis 56 of the nose cone 40.

Figure 7:
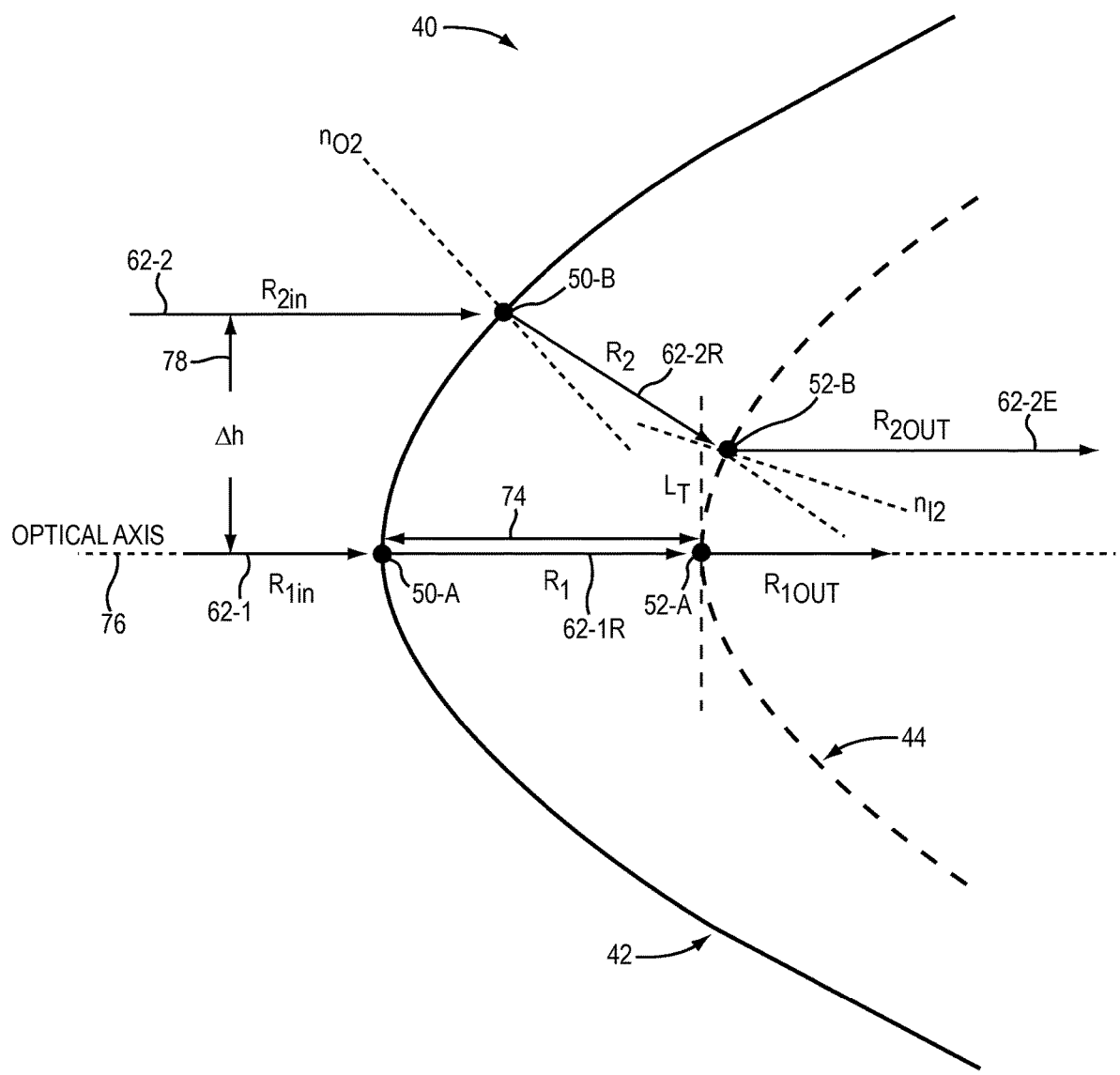
FIG. 7 is a diagram illustrating a process for determining an inner nose cone surface according to another embodiment.

FIG. 7 is a block diagram illustrating a process for determining the inner nose cone surface 44 according to another embodiment. In this embodiment, it will again be assumed, for purposes of illustration, that the goal is to define the inner nose cone surface 44 given a functional description of the outer conformal nose cone surface 42, a predetermined optical material, and a center thickness 74 between the outer conformal nose cone surface 42 and the inner nose cone surface 44 on an optical axis 76 of the nose cone 40. Further assumptions, for purposes of illustration, are that the light rays 62 incident on the outer conformal nose cone surface 42 are collimated, and it is desired to create collimated light rays 62 that exit the inner nose cone surface 44.

Starting with the light ray 62-1 ($R_{1in}$) incident on the outer conformal nose cone surface 42 at a light ray location 50-A, given the refracted light ray 62-1R ($R_1$), and the thickness 74, a point 52-A is determined. A slope of the tangent of the inner nose cone surface 44 at the point 52-A is determined. Because the point 52-A is at the optical axis 76, the slope of the tangent is vertical, and the thickness 74 is not relevant, but at every other point 52, the thickness of the nose cone 40 is determined at the respective point 52 so that effects of the index of refraction of the material are taken into consideration.

A predetermined distance 78 (Δh) is used to determine a second light ray 62-2 ($R_{2in}$) that is parallel to the light ray 62-1 but displaced from the light ray 62-1 by the distance 78. For purposes of illustration and discussion, the predetermined distance 78 is not to scale, and in practice the predetermined distance 78 may be on the order of microns. It is determined that the second light ray 62-2 intersects the outer conformal nose cone surface 42 at a light ray location 50-B. An angle of incidence of the second light ray 62-2 is determined with respect to a surface normal, $n_{O2}$, at the light ray location 50-B. The slope of the refracted light ray 62-2R is determined at the light ray location 50-B, and the equation of the line for the refracted light ray 62-2R ($R_2$) is determined. Using the slope of the refracted light ray 62-2R and the pre-defined slope of a desired exit light ray 62-2E ($R_{2out}$), determine a resultant slope of an inner surface normal $n_{I2}$ at the point 52-B (yet to be determined) that provides the pre-defined slope for the exit light ray 62-2E.

An equation of a line $L_T$ that is tangent to the inner nose cone surface 44 at the point 52-A using the location of the point 52-A and the slope of the light ray 62-1R is defined. The point 52-B located at the intersection of the lines determined for the refracted light ray 62-2R and the line $L_T$ is determined. This identifies the precise location of the point 52-B on the inner nose cone surface 44 for an incident light ray at the light ray location 50-B.

The slope of the inner surface at the point 52-B is determined based on the slope of the inner surface normal $n_{r2}$ and saved for the next point 52 (not illustrated). By now utilizing the point 52-B and the slope of the inner surface 44 at the point 52-B, the process may be repeated iteratively over the entire optical aperture of the nose cone 40. The locations of each point 52 define the inner nose cone surface 44. In practice, hundreds of thousands, or millions, of points 52 may be determined for the nose cone surface 44.

Those skilled in the art will appreciate that the points 52 can then be fit in a desired mathematical representation, such as by using spline, linear, or non-linear interpolation techniques, for inclusion in other design tools such as CAD or optical design programs for further design specification and/or analysis. The density of points chosen should be fine enough to ensure a desired beam pattern.

In some embodiments, the nose cone 40 comprises additional corrective optics that operate in conjunction with the nose cone 40 such that the nose cone 40 is an integral part of an overall focusing optical system.

In some embodiments, the nose cone 40 comprises an imaging device such as, for example, a focal plane array with corrective image processing to reduce residual errors in the image plane of the focusing optics.

In some embodiments, the nose cone 40 comprises one or more reflective or refractive spatial light modulators and/or diffractive optical elements.

In some embodiments, the inner surface 44 may include slits or grooves, such as, for example, the grooves that define a Fresnel lens, to shape the output beam 22 in a desired manner.

In some embodiments, the nose cone 40 may have obscured areas within the field of regard that are not transparent to EMR in the relevant bands. Such obscured areas may include, for example, an obscured tip that is obscured by heat ablating materials. In such embodiments, the precise area of the outer conformal nose cone surface 42 may be determined, and the determination of light rays 62 is not made at such locations. In other embodiments, the existence of an obscured area of the outer conformal nose cone surface 42 may in practice not materially affect the desired beam pattern, and thus may be ignored.

While, for purposes of illustration, the embodiments have been described in the context of generating a definition of an inner nose cone surface based on a definition of an outer nose cone surface, it is apparent that the principles disclosed herein can also be used to determine a definition of an outer nose cone surface based on a definition of an inner nose cone surface.

Those skilled in the art will recognize improvements and modifications to the preferred embodiments of the disclosure. All such improvements and modifications are considered within the scope of the concepts disclosed herein and the claims that follow.

What is claimed is:

1. A method for generating a functional definition of a surface of a hollow nose cone shell comprising a transparent material and having an interior void, comprising:
   accessing, by a computing device comprising a processor, a first functional definition of a first surface that comprises one of an outer nose cone surface and an inner nose cone surface;
   determining, at a plane in the interior void, a desired beam pattern of light that is transmitted through the hollow nose cone shell;
   determining an optical prescription of a second surface that comprises one of the outer nose cone surface and the inner nose cone surface, the second surface being different from the first surface, wherein the optical prescription provides the desired beam pattern of light at the plane in the interior void based on the first functional definition;
   generating a second functional definition that identifies the optical prescription by, for each respective light ray location of a plurality of different light ray locations on the second surface, determining a slope for the respective light ray location that is required to direct a light ray exiting the respective light ray location in a desired direction into the interior void of the hollow nose cone shell; and
   storing the second functional definition in a storage device.

2. The method of claim 1 wherein the plurality of different light ray locations on the second surface comprises over one thousand locations on the second surface.

3. The method of claim 1 wherein the first functional definition of the first surface identifies an obscuration area on the first surface, and further comprising:
   determining the plurality of different light ray locations such that no light ray location of the plurality of different light ray locations is within the obscuration area on the first surface.

4. The method of claim 1 further comprising manufacturing a nose cone having the first surface defined by the first functional definition and having the second surface defined by the second functional definition.

5. The method of claim 1, further comprising:
   determining a thickness of the hollow nose cone shell at at least one location of the first surface;
   identifying a plurality of first light ray locations on the first surface;
   based on the at least one location of the first surface, the desired beam pattern of light, the transparent material, and a predetermined angle of incidence of a light ray at each first light ray location, determining the plurality of different light ray locations on the second surface and the slope of the second surface at each light ray location that is required to direct the light ray exiting the respective light ray location in the desired direction into the interior void of the hollow nose cone shell; and
   determining the second functional definition based on the plurality of respective light ray locations on the second surface.

6. The method of claim 5, wherein the first surface is an outer conformal surface of the hollow nose cone shell and the second surface is an inner surface of the hollow nose cone shell.

7. The method of claim 5, wherein the desired beam pattern of light is one of a converging beam pattern, a diverging beam pattern, and a collimated beam pattern.

8. The method of claim 5, wherein the at least one location of the first surface comprises a location that intersects an axis of symmetry of the hollow nose cone shell.

9. The method of claim 5, wherein the second surface is an outer conformal surface of the hollow nose cone shell and the first surface is an inner surface of the hollow nose cone shell.

10. An apparatus for generating a functional definition of a surface of a hollow nose cone shell comprising a transparent material and having an interior void, comprising:
- a memory; and
- a processing device coupled to the memory and configured to:
  - access, by a computing device comprising a processor, a first functional definition of a first surface that comprises one of an outer nose cone surface and an inner nose cone surface;
  - determine, at a plane in the interior void, a desired beam pattern of light that is transmitted through the hollow nose cone shell;
  - determine an optical prescription of a second surface that comprises one of the outer nose cone surface and the inner nose cone surface, the second surface being different from the first surface, wherein the optical prescription provides the desired beam pattern of light at the plane in the interior void based on the first functional definition;
  - generate a second functional definition that identifies the optical prescription by, for each respective light ray location of a plurality of different light ray locations on the second surface, determining a slope for the respective light ray location that is required to direct a light ray exiting the respective light ray location in a desired direction into the interior void of the hollow nose cone shell; and
  - store the second functional definition in a storage device.

11. The apparatus of claim 10, wherein the desired beam pattern of light is one of a converging beam pattern, a diverging beam pattern, and a collimated beam pattern.

12. The apparatus of claim 10, wherein the first surface is an outer conformal surface of the hollow nose cone shell and the second surface is an inner surface of the hollow nose cone shell.

13. The apparatus of claim 12, wherein the second surface is an outer conformal surface of the hollow nose cone shell and the first surface is an inner surface of the hollow nose cone shell.

14. A method for defining an inner nose cone surface of a hollow nose cone comprising an outer nose cone surface, comprising:
- accessing a functional definition of the outer nose cone surface of the hollow nose cone, the hollow nose cone comprising a transparent material;
- identifying a plurality of first light ray locations on the outer nose cone surface;
- determining, for the plurality of first light ray locations, a corresponding plurality of inner surface light ray locations on the inner nose cone surface and a plurality of inner surface slopes, wherein each inner surface slope defines a slope of the inner nose cone surface at a corresponding inner surface light ray location by, for each first light ray location of the plurality of first light ray locations:
  - determining a path through the transparent material that a light ray travels given a predetermined angle of incidence of the light ray on the outer nose cone surface at the first light ray location;
  - determining the corresponding second light ray location on the inner nose cone surface at which the light ray will exit the inner nose cone surface given the path; and
  - determining the inner surface slope of the corresponding second light ray location required to direct the light ray in a desired direction into a void of the hollow nose cone; and
- defining the inner nose cone surface based on the plurality of inner surface light ray locations.

15. The method of claim 14, wherein defining the inner nose cone surface further comprises fitting a polynomial to the plurality of inner surface light ray locations.

16. The method of claim 14, wherein determining the path through the transparent material that the light ray travels given the predetermined angle of incidence of the light ray on the outer nose cone surface at the first light ray location comprises determining the path through the transparent material that the light ray travels given the predetermined angle of incidence of the light ray on the outer nose cone surface at the first light ray location based at least in part on the transparent material.

17. The method of claim of claim 14, wherein determining the inner surface slope of the corresponding second light ray location required to direct the light ray in a desired direction into the void of the hollow nose cone is based at least in part on a desired optical power of the hollow nose cone.

18. An apparatus for defining an inner nose cone surface of a hollow nose cone comprising an outer nose cone surface, comprising:
- a memory; and
- a processing device coupled to the memory and configured to:
  - access a functional definition of the outer nose cone surface of the hollow nose cone, the hollow nose cone comprising a transparent material;
  - identify a plurality of first light ray locations on the outer nose cone surface;
  - determine, for the plurality of first light ray locations, a corresponding plurality of inner surface light ray locations on the inner nose cone surface and a plurality of inner surface slopes, wherein each inner surface slope defines a slope of the inner nose cone surface at a corresponding inner surface light ray location by, for each first light ray location of the plurality of first light ray locations:
    - determine a path through the transparent material that a light ray travels given a predetermined angle of incidence of the light ray on the outer nose cone surface at the first light ray location;
    - determine the corresponding second light ray location on the inner nose cone surface at which the light ray will exit the inner nose cone surface given the path; and
    - determine the inner surface slope of the corresponding second light ray location required to direct the light ray in a desired direction into a void of the hollow nose cone; and
  - define the inner nose cone surface based on the plurality of inner surface light ray locations.

* * * * *